(12) United States Patent
Mifuji et al.

(10) Patent No.: US 6,169,040 B1
(45) Date of Patent: Jan. 2, 2001

(54) METHOD OF MANUFACTURING SEMICONDUCTOR DEVICE

(75) Inventors: Michihiko Mifuji; Satoshi Kageyama, both of Kyoto (JP)

(73) Assignee: Rohm Co., Ltd., Kyoto (JP)

( * ) Notice: Under 35 U.S.C. 154(b), the term of this patent shall be extended for 0 days.

(21) Appl. No.: 09/421,091

(22) Filed: Oct. 19, 1999

(30) Foreign Application Priority Data

Oct. 20, 1998 (JP) .................................. 10-297821

(51) Int. Cl.⁷ ........................ H01L 21/31; H01L 21/4763
(52) U.S. Cl. ........................ 438/763; 438/623; 438/624
(58) Field of Search .................... 438/623, 624, 438/763

(56) References Cited

U.S. PATENT DOCUMENTS 6,060,384 * 5/2000 Chen et al. ............................ 438/623
6,074,941 * 6/2000 Hsieh et al. ........................... 438/624

* cited by examiner

*Primary Examiner*—John F. Niebling
*Assistant Examiner*—Alexander G. Ghyka
(74) *Attorney, Agent, or Firm*—Morgan, Lewis & Bockius LLP

(57) ABSTRACT

A USG layer 26 is formed to cover an aluminum wiring 24 deposited a field oxide film 22. An organic SOG layer 28 whose thick layer can be easily formed is formed in a groove on the surface of the USG layer 26. Thus, the unevenness of the surface of the USG layer 26 can be relaxed in a degree. Further, an USG layer 30 is formed thereon is formed through the vapor phase growth technique using the high density plasma which can realize excellent embedding. Accordingly, the inter-metal dielectric film 32 having a flat upper surface can be formed. Further, the SOG step is carried out only once in the step of forming the organic SOG layer 28, thereby reducing the production cost. Further, since the organic SOG layer 28 can be encircled by the USG layers 26 and 39 having good film quality, even if the material of the organic SOG layer 28 is not so good, the inter-metal dielectric film 32 with an excellent dielectric property can be formed. Thus, a method for manufacturing a semiconductor device which can form the dielectric film having excellent dielectric property and an upper flat surface at low production cost and in a short lead time.

8 Claims, 13 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device, and more particularly to a technique for forming a dielectric film on an underlying layer having an uneven surface.

2. Description of the Related Art

Several techniques have been proposed for flattening the upper surface of an inter-metal dielectric film when a semiconductor device such as VLSI (very large scaled integration) is manufactured. FIGS. 9–13 show an example of a process for manufacturing a semiconductor device using a conventional technique for flattening an inter-metal dielectric film.

According to the conventional manufacturing process, as shown in FIG. 9, a semiconductor substrate 1 on which a field oxide film 2 is formed is prepared. On the field oxide film 2 and semiconductor substrate 1, a MOSFET (metal-oxide-silicon field effect transistor) 7 including a polycrystalline silicon gate 5 is formed.

A pre-metal dielectric film (PMD) 3 is formed so as to cover these regions. The pre-metal dielectric film 3 is made of e.g. PSG (phosphorus-doped silicon oxide film) or BPSG (boron-and-phosphorus doped silicon oxide film). An aluminum wiring 4 is formed on the pre-metal dielectric film 3.

Using e.g. CVD (chemical vapor deposition) technique, a USG (undoped silicate glass) is deposited to form an USG layer 6. Using SOG (Spin On Glass) technique, an organic SOG layer is formed thereon by application in such a manner that it is embedded in the upper concave areas or grooves of the USG layer. The organic SOG layer is made of a dielectric material whose thick layer can be easily formed.

As shown in FIG. 10, an unnecessary area of the organic SOG layer is removed by etch back. The etch back step is executed in a manner of slight over-etch so that the organic SOG layer 8 is not left immediately above the aluminum wiring layer 4. Thus, as seen from FIG. 10, the upper surface of the organic SOG layer 8 which is left on the upper surface of the USG layer 6 is also slightly lowered.

In order that the lowered area is embedded, as shown in FIG. 11, an inorganic SOG layer 10 of an inorganic dielectric material with a high pattern-following property is formed by application. Further, as shown in FIG. 12, an unnecessary area of the inorganic SOG layer 10 is removed by etch-back. Thus, the concave area in the upper surface of the USG layer 6 is substantially completely embedded with the inorganic SOG layer 10.

Further, using CVD technique, USG is deposited thereon to form a USG layer 12. In this way, an inter-metal dielectric layer 14 is formed.

In this way, the concave area or groove on the upper surface of the USG layer 6 is embedded with the organic SOG layer 8 made of an organic dielectric material which can easily provide its thick layer and the inorganic SOG layer 10 made of an inorganic dielectric material with a high pattern-following property. In addition, the SOG layers 8 and 10 having relatively poor substance quality (not fine) are encircled by the USG layers 6 and 12 having a fine and relatively good substance quality. Thus, an inter metal insulating film 14 having an flat upper surface with excellent insulating property can be obtained.

However, the above conventional method of forming an inter metal dielectric film 14 has the following defects. The SOG process requires a number of steps and activities. For example, after the SOG layer has been applied and before the unnecessary area is removed by etch back, the steps of measuring the thickness of the applied SOG layer and annealing it are required. The etch back process for the SOG layer requires a step of measuring the thickness of the remaining film. After the etch back process, in order to remove the particles generated in the etch back process, a desquamation step using $O_2$ plasma and a scrubber step using a brush are required. In addition, silicon compound (in generally such as $R_nSi(OH)_{4-n}$) used as the dielectric material in the SOG process is relatively expensive.

The above conventional method of forming an inter-metal dielectric film 14 in which the SOG step must be made twice have defects of requiring a long lead time and high production cost. The present invention intends to overcome these defects.

SUMMARY OF THE INVENTION

An object of the present invention is to provide a method of manufacturing a semiconductor device which can form a dielectric film with an upper flat surface with an excellent dielectric property at low cost and in a short lead time.

In order to attain the above object, in accordance with the present invention, there is provided a method of manufacturing a semiconductor device having an inter-metal dielectric film composed of a first dielectric film and a second dielectric film formed by a process comprising the steps: depositing the first dielectric film silicon oxide on an underlying wiring layer having an uneven surface; applying organic SOG on the first dielectric film thus formed, and etching back the organic SOG thus applied so that the organic SOG remains in a groove in a surface of the first dielectric film; and depositing the second dielectric film on said first dielectric film inclusive of the remaining organic SOG through a vapor phase growth method using high density plasma.

Thus, the organic SOG layer whose thick layer can be easily formed is left so that the unevenness of the surface of the USG layer is relaxed in a degree. In addition, the USG layer is formed through the vapor phase growth technique using the high density plasma which can realize excellent embedding. Accordingly, the inter-metal dielectric film having a flat upper surface can be formed.

The SOG step accompanied by high cost is carried out only once in the step of forming the organic SOG layer. The step of forming the inorganic SOG layer is not required so that the production cost can be reduced correspondingly. The lead time required for production can be also shortened. As a result, the cost required for forming the inter-metal dielectric film can be reduced and the lead time for production can be shortened.

Further, since the organic SOG layer left in the groove on the surface of the USG layer can be encircled by the USG layers and having good film quality, even if the material of the organic SOG layer is not so good, the inter-metal dielectric film with excellent dielectric property can be formed.

In summary, the inter-metal dielectric film having a flat upper surface with excellent dielectric property can be formed at low cost and in a short lead time.

A second aspect of the method is a method according to the first aspect, wherein the step of forming the first dielectric film comprises a step of forming a silicon oxide film through CVD.

A third aspect of the method is a method according to the first aspect, wherein the step of forming the second dielectric film comprises a step of forming a silicon oxide film through a vapor phase growth technique using the high density plasma.

A fourth aspect of the method is a method according to the first aspect, wherein the step of applying organic SOG comprises the step of etching back the organic SOG thus applied so that the organic SOG remains in a groove whose opening diameter is more than 0.1 μm; and the step of forming the second dielectric film comprises a step of forming a silicon oxide film through a vapor phase growth technique using the high density plasma so that the groove is embedded.

A fifth aspect of the method is a method of manufacturing a semiconductor device having a dielectric film composed of a first dielectric film and a second dielectric film formed by a process comprising the steps:

depositing silicon oxide on an underlying wiring layer having an uneven surface to form the first dielectric film;

filling a groove of the first dielectric film thus formed with a dielectric material; and forming the second dielectric film on the first dielectric film inclusive of the filled dielectric through a vapor phase growth method using high density plasma, thereby forming a second dielectric film.

Thus, the groove on the surface of the first dielectric film is filled with dielectric so that the unevenness of the surface of the first dielectric film is relaxed in a degree. In addition, the second dielectric film is formed on the first dielectric film through the vapor phase growth technique using the high density plasma which can realize excellent embedding. Accordingly, the dielectric film 32 having a flat upper surface can be formed.

The step of filling the groove in the surface of the first dielectric film is carried out only once. Therefore, the cost required for forming the dielectric film can be reduced correspondingly. The lead time required for production can be also shortened.

Further, since the dielectric filled in the groove on the surface of the first dielectric film can be encircled by the first dielectric film and the second dielectric film, even if the quality of the dielectric material filled in the groove of the surface of the first dielectric film is not so good, as long as the film quality of the first and second dielectric film is made excellent, the dielectric film with excellent dielectric property can be obtained.

In summary, the dielectric film having a flat upper flat surface with an excellent dielectric property can be formed at low cost and in a short lead time.

A sixth aspect of the method is a method according to the fifth aspect, wherein the dielectric material is made of HSQ.

According to the sixth aspect, since dielectric constant of HSQ is low, parasitic capacitance can be reduced.

A seventh aspect of the method is a method according to the fifth aspect, wherein the dielectric material is made of HSG.

According to the seventh aspect, since dielectric constant of HSG is low, parasitic capacitance can be reduced.

An eighth aspect of the method is a method according to the fifth aspect, wherein at least one of the first and second dielectric material is made of FSG.

According to the eighth aspect, since dielectric constant of FSG is low, parasitic capacitance can be reduced.

The above and other objects and features of the present invention will be more apparent from the following description taken in conjunction with the accompanying drawings.

DESCRIPTION OF THE PREFERRED EMBODIMENTS

FIGS. 1 to 5 are sectional views for explaining a method of forming an inter-metal dielectric film in a process for manufacturing a semiconductor device according to an embodiment of the present invention. Specifically, FIGS. 1 to 5 show a sectional structure of the semiconductor device such as a VLSI (very-large-scale integration) in each of manufacturing steps.

Figure 1:
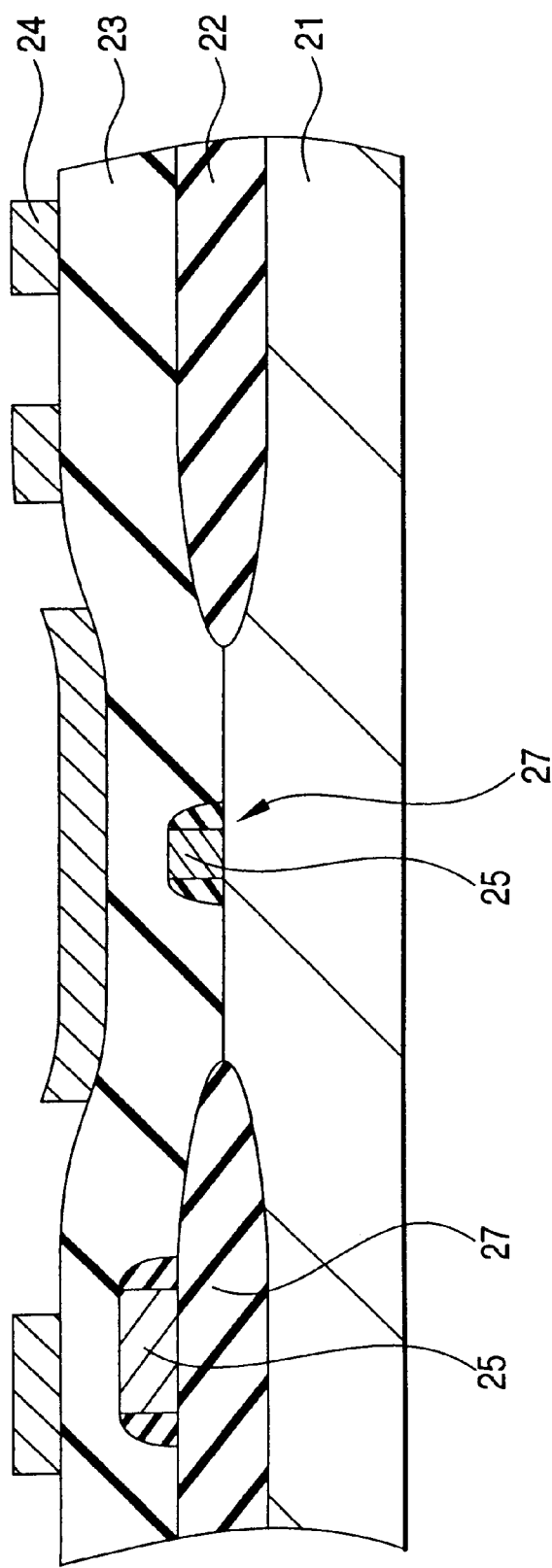
FIGS. 1 to 6 are sectional views for explaining a method of forming an inter-metal dielectric film in a process for manufacturing a semiconductor device according to an embodiment of the present invention.
Figure 2:
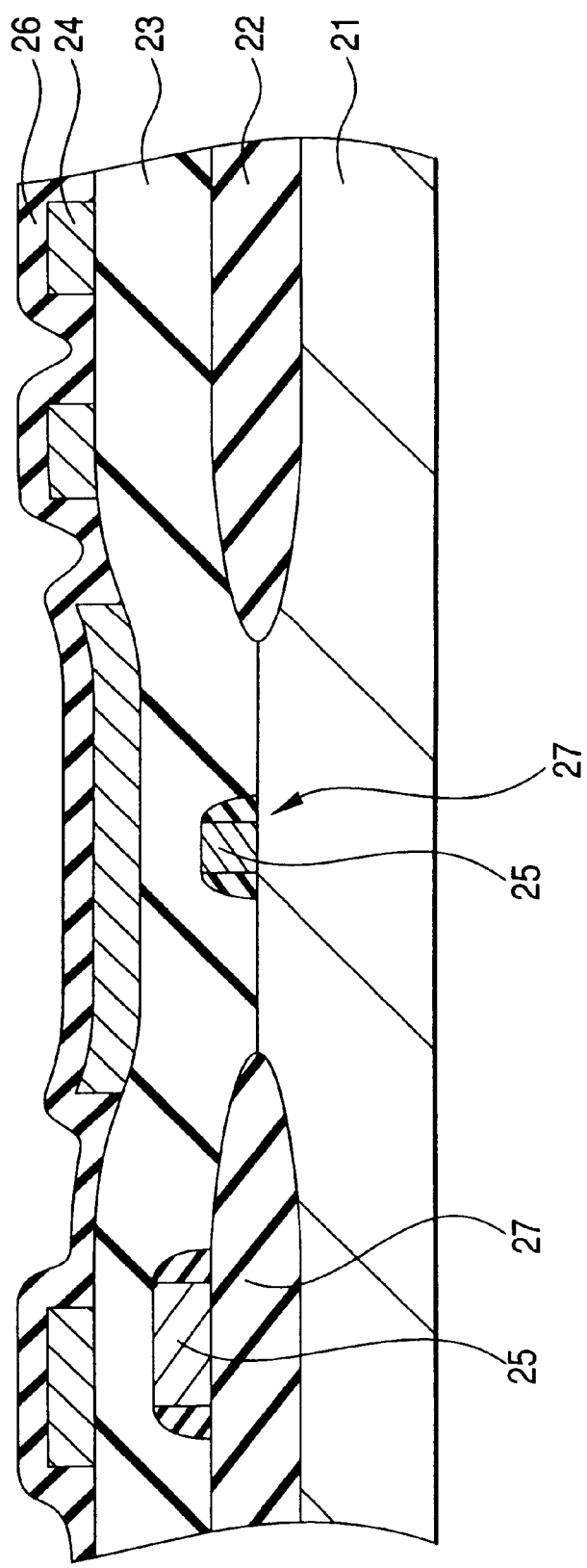

As shown in FIG. 1, a semiconductor 21 on which a field oxide film 22 is formed is prepared. On the field oxide film 22 and semiconductor substrate 21, a MOSFET (metal-oxide-silicon field effect transistor) 7 including a polycrystalline silicon gate 25 is formed.

A pre-metal dielectric film (PMD) 23 is formed so as to cover these regions. The pre-metal dielectric film 3 is made of e.g. PSG (phosphorus-doped silicon oxide film) or BPSG (boron-and-phosphorus doped silicon oxide film). An aluminum wiring 24 is formed on the pre-metal dielectric film 23. The state as shown in FIG. 1 where the aluminum layer 24 has been formed in this way corresponds to an underlying wiring layer (underlying layer).

Using e.g. plasma CVD (chemical vapor deposition) technique, a USG (undoped silicate glass) that is a silicon oxide (dielectric material) is deposited to form an USG layer 26 as a first dielectric film. In this step, the film thickness t1 of the USG layer 26 deposited on the aluminum wiring 24 is measured and the surface is examined.

Figure 3:
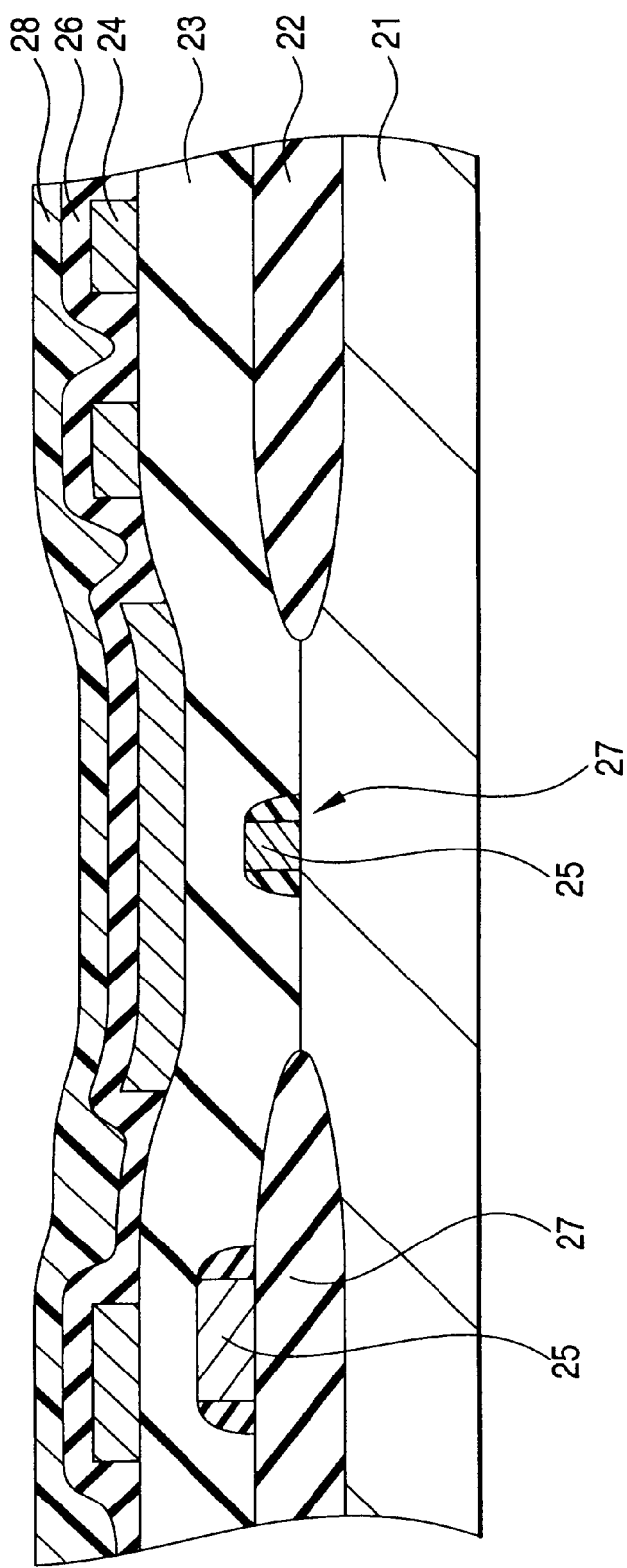

As shown in FIG. 3, using SOG (Spin On Glass) technique, an organic SOG layer consisting of a silicon compound is formed thereon by application in such a manner that it is embedded in the upper concave areas or grooves of the USG layer. The organic SOG layer is made of dielectric whose thick layer can be easily formed. In this step, the thickness of the organic SOG layer 28 is measured.

Figure 4:
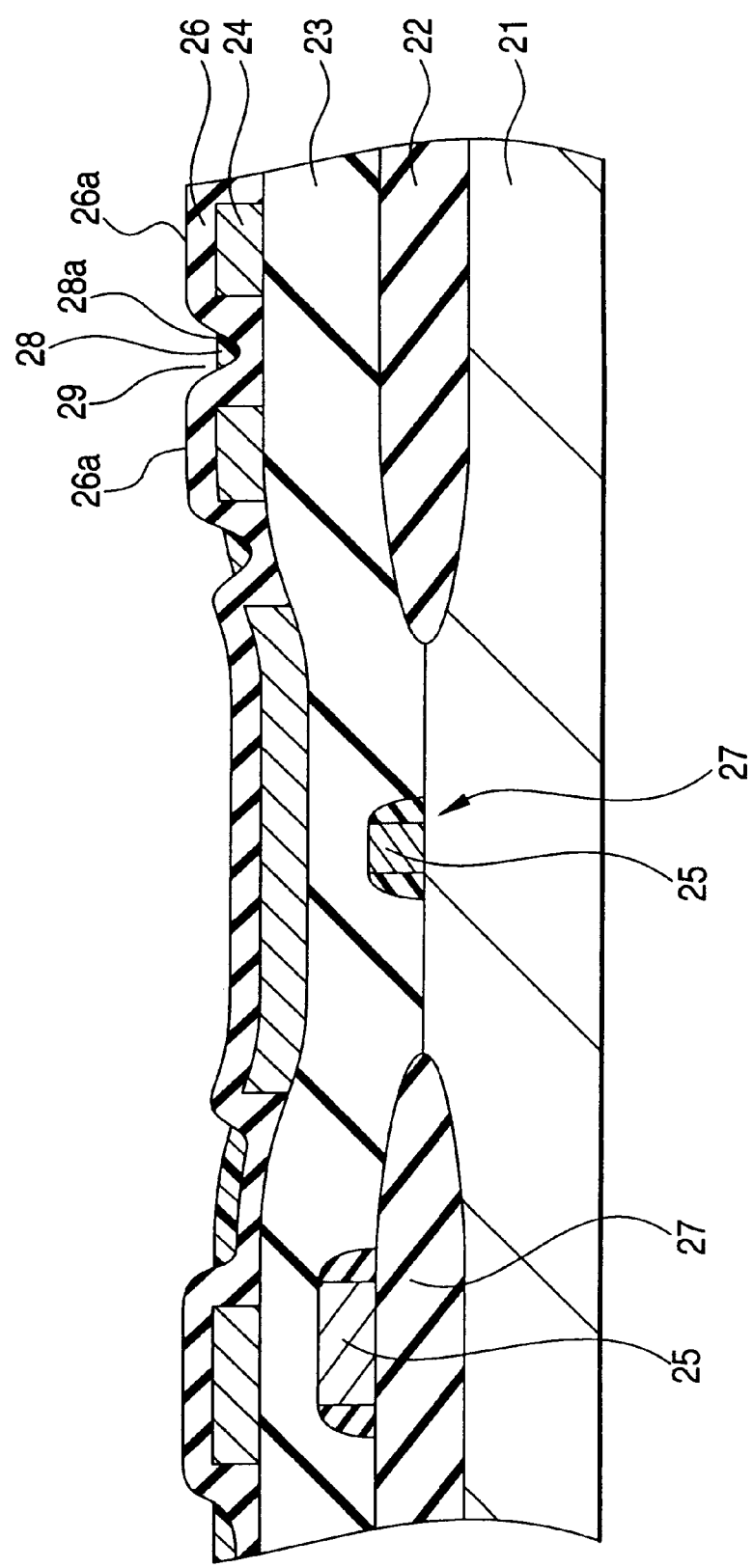

The organic SOG layer 28 is annealed. Thereafter, as shown in FIG. 4, an unnecessary area of the organic SOG layer 28 is removed by etch back. The etch back step is executed in a manner of slight over-etch so that the organic SOG layer 28 is not left immediately above the aluminum wiring layer 24.

Thus, as seen from FIG. 4, the upper surface 28*a* of the organic SOG layer 28 which is left on the upper surface of the USG layer 26 is slightly lower than the top 26*a* of the USG layer 26 to form a shallow groove (convex area) 29.

Figure 7A:
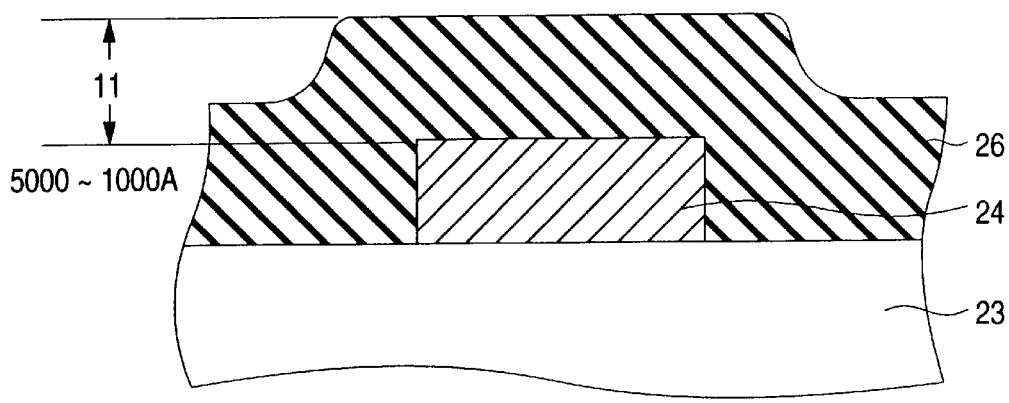
FIGS. 7A and 7B are sectional views for explaining a method of forming an inter-metal dielectric film in a process for manufacturing a semiconductor device according to an embodiment of the present invention.
Figure 7B:
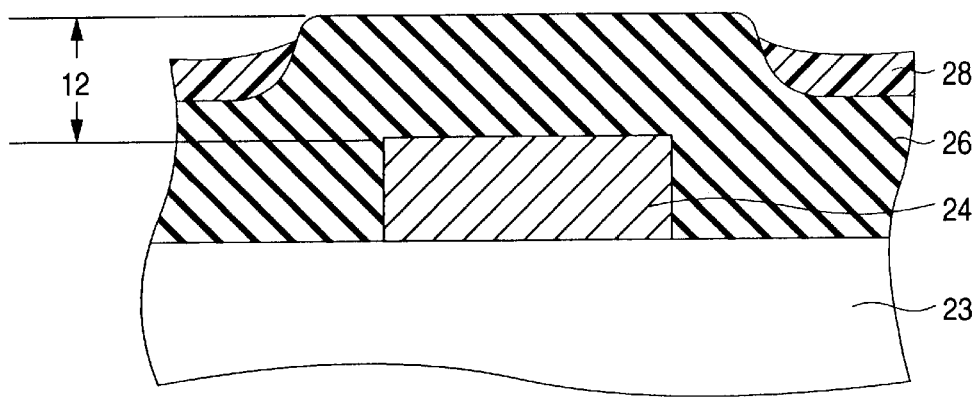

In this step, the remaining film thickness t2 of the USG layer 26 on the aluminum wiring 24 is measured (FIG. 7B). By knowing a difference (t1−t2) between the original film thickness t1 of the USG layer 26 and the remaining film thickness t1, the reduction in the film thickness of the USG film layer 26 can be obtained. If t1−t2>0, the organic SOG layer 28 is not left on the aluminum wiring 24.

After the etch back step, in order to remove the particles generated in the etch back process, a desquamation step using $O_2$ plasma and a scrubber step using a brush are carried out.

Figure 5:
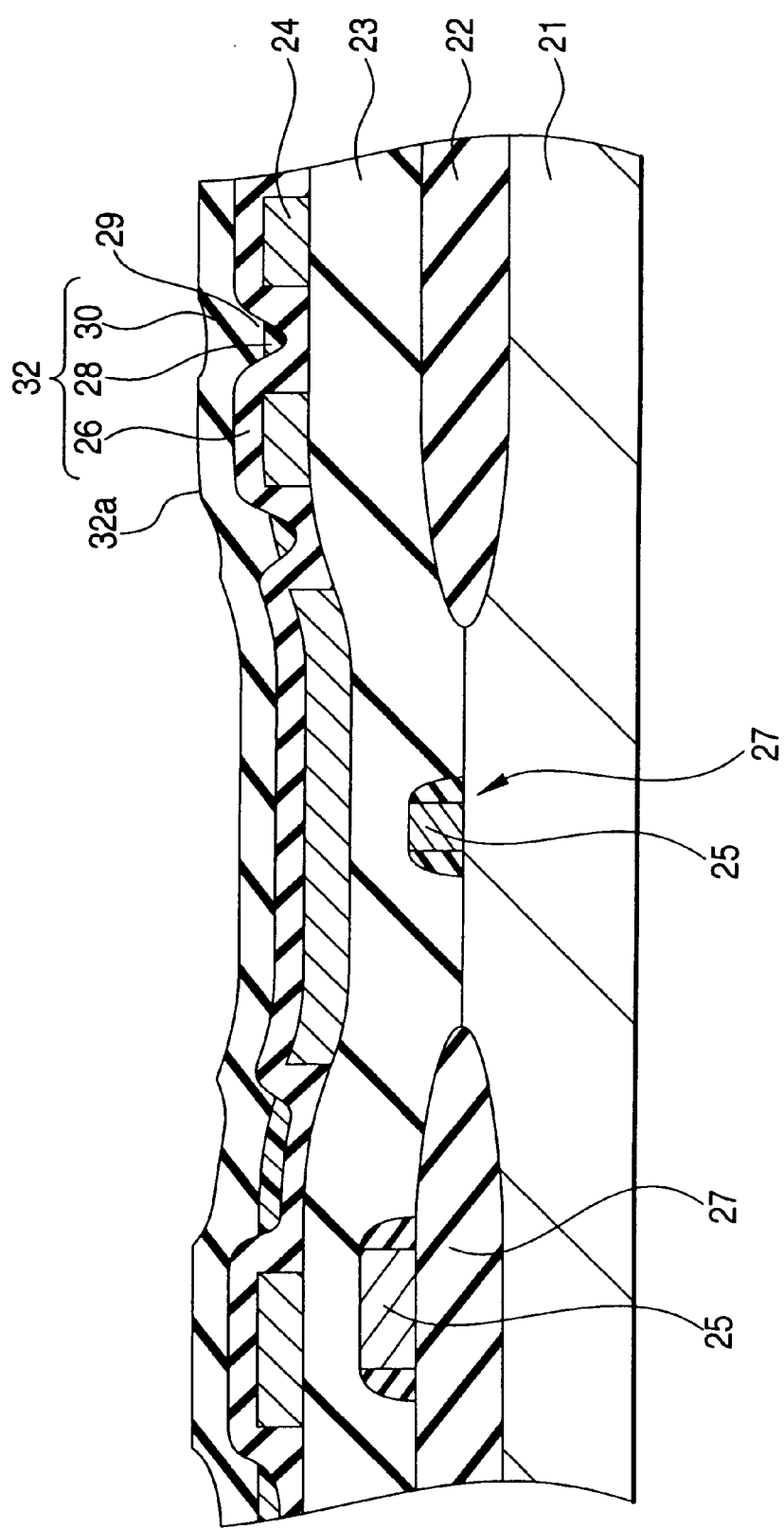

Thereafter, as shown in FIG. 5, on the upper surface of the USG layer 26 inclusive of the remaining organic SOG layer 28, USG that is silicon oxide is deposited using the high density plasma CVD technique. Thus, a USG layer 30 serving as a second dielectric film is formed. As described later, the high density plasma CVD technique can realize excellent embedding so that with the upper surface 30a of the USG layer 30 being kept flat, the groove or concave portion 29 can embedded with the USG.

Thereafter, a cleansing step, an SOG step, etc. are carried out. Thus, an inter-metal dielectric film 32 in which the SOG layer 28 is encircled by the USG layers 26 and 30 having good film quality.

Figure 8:
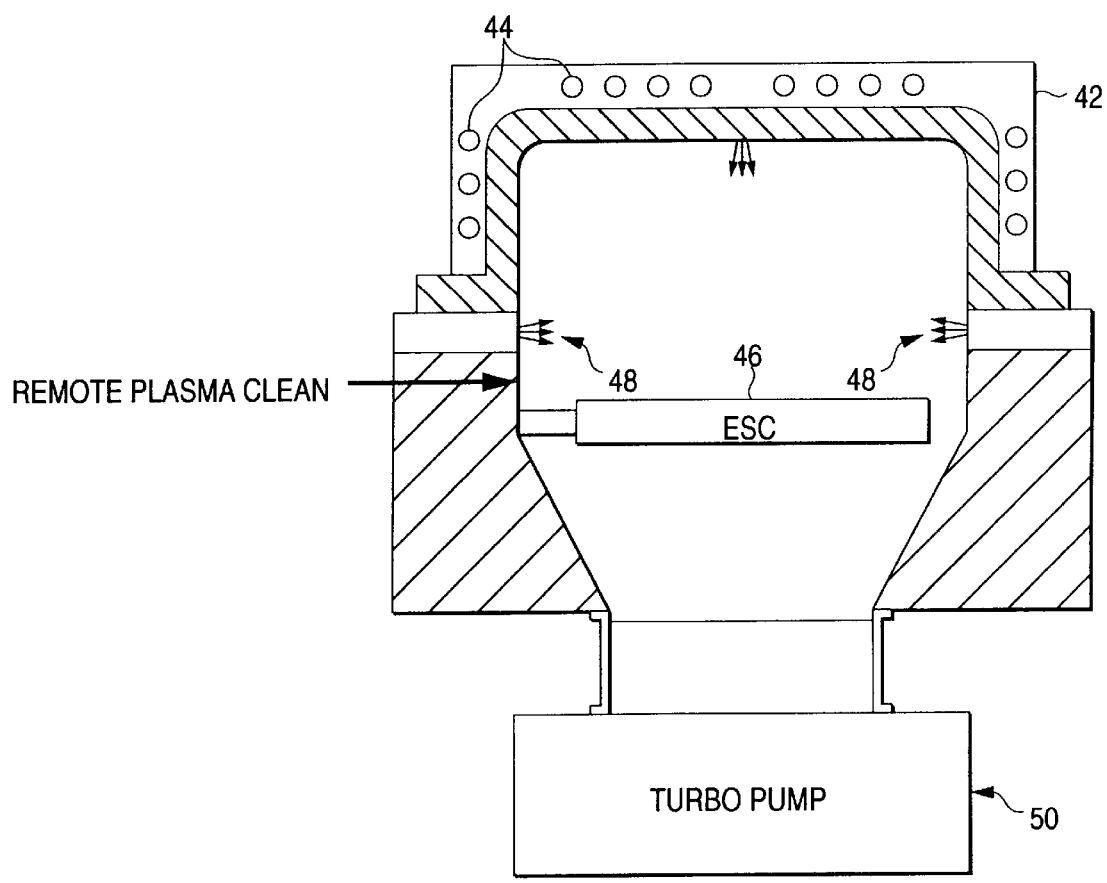
FIG. 8 is a sectional view showing an example of a high density plasma CVD apparatus using a high density plasma CVD technique.
Figure 9:
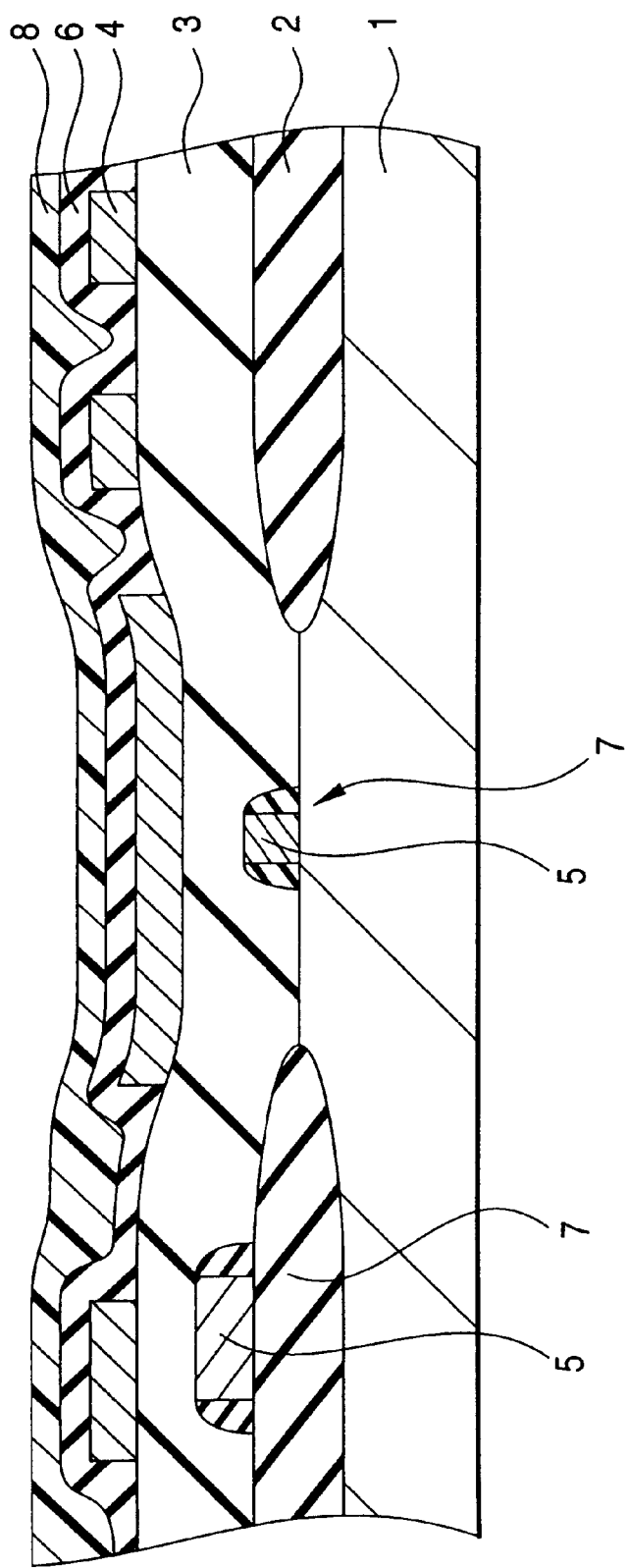
FIGS. 9 to 13 are sectional views for explaining a typical process for manufacturing a semiconductor device using a conventional inter-metal dielectric film flattening technique.
Figure 10:
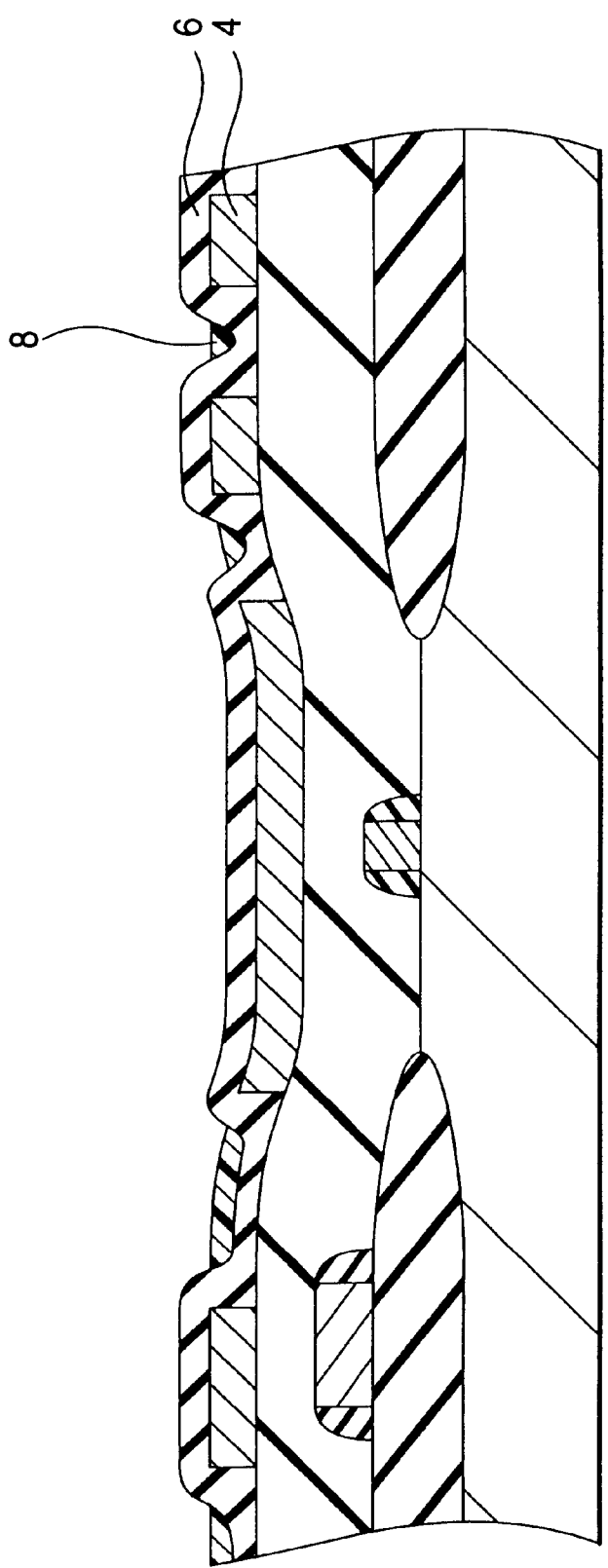
Figure 11:
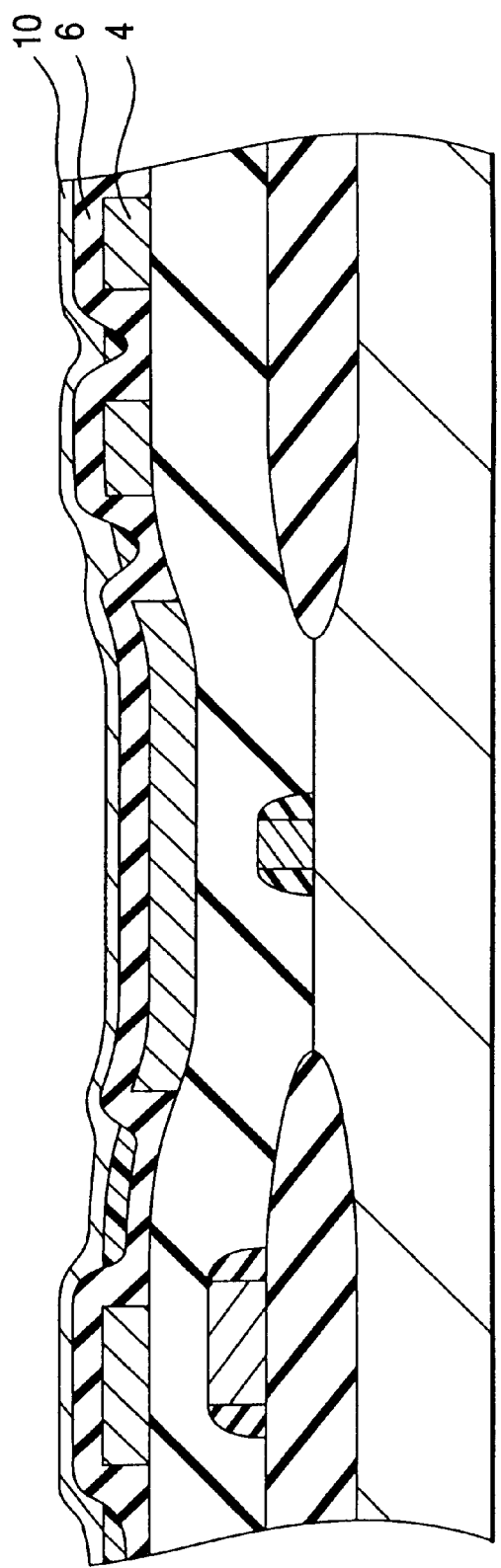
Figure 12:
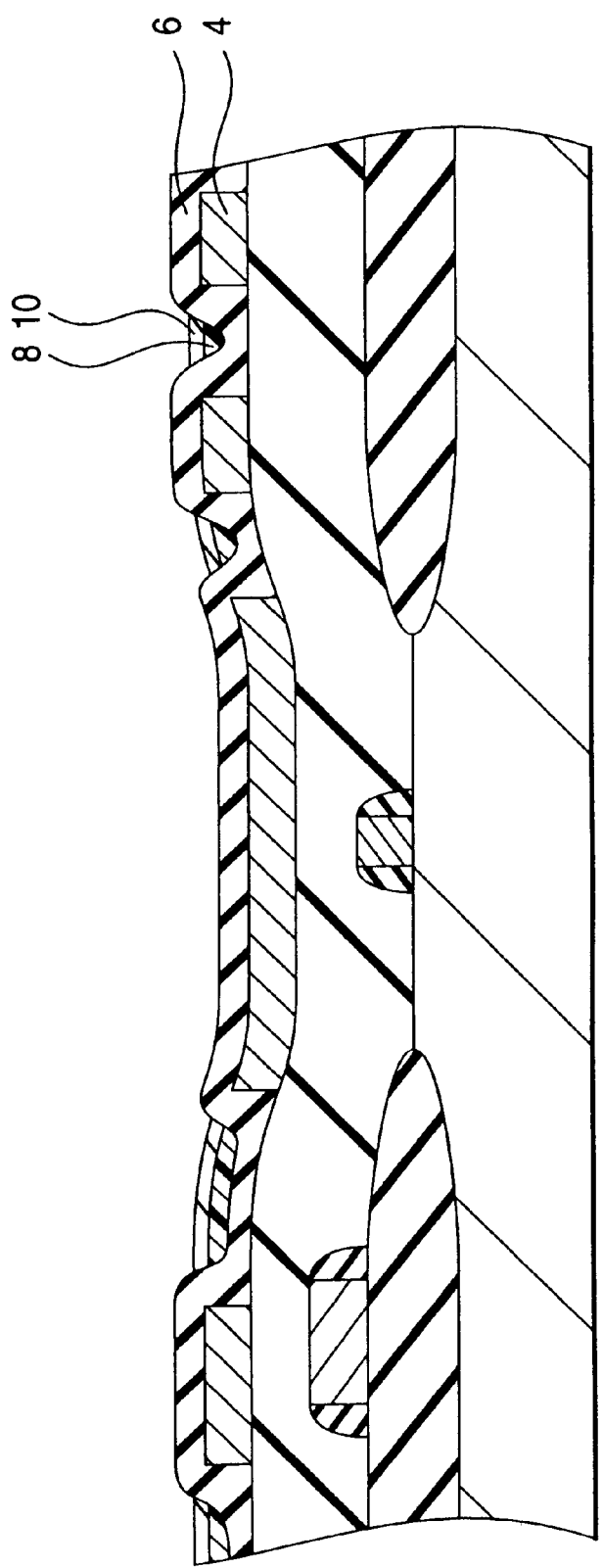
Figure 13:
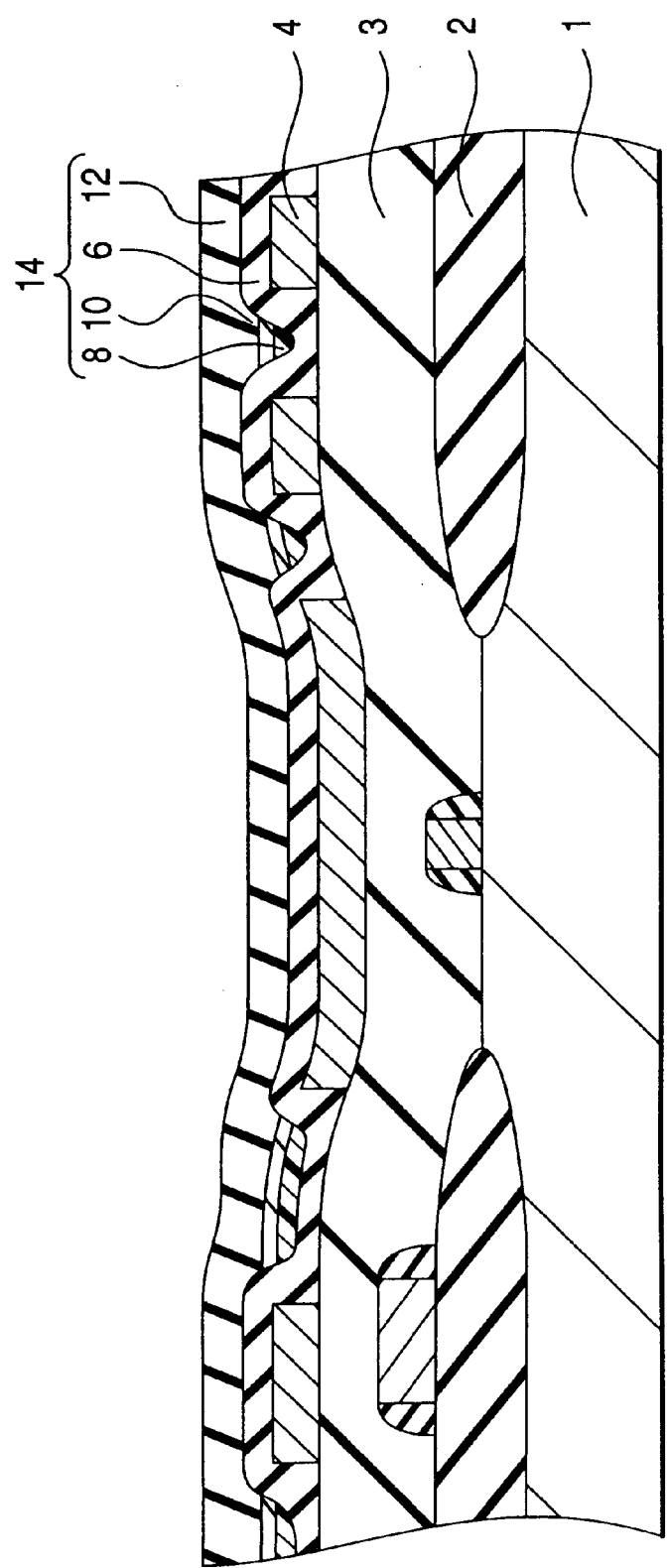

FIG. 8 shows an example of a high-density plasma CVD apparatus which is used for the high-density plasma CVD technique. The high-density plasma CVD apparatus, which carries out the formation of a film by the CVD technique and etching by sputtering, can provide an excellent film with good embedding property. As a plasma source for the high-density plasma CVD apparatus, ECR (electron cyclotron resonance) and ICP (inductively coupled plasma) are generally used.

A high-density plasma CVD apparatus 40 shown in FIG. 8 uses ICP (inductively coupled plasma) as a plasma source. The high-density plasma CVD apparatus 40 is provided with a ceramic dome 42. On the outer periphery of the ceramic dome 42, a coil 44 made of copper is arranged. A low frequency power at 300 kHz–2 MHz is applied to the coil 44. A high-density plasma with $10^{11}$–$10^{12}$ ions/cm$^3$ is formed by inductive coupling energy.

Within a chamber of the high density plasma CVD apparatus 40, an electrostatic chuck 46 for placing a wafer W on which a semiconductor device is formed is provided. A He gas for cooling is supplied between the surface of the electrostatic chuck 46 and rear surface of the wafer W. By adjusting the temperature of the plasma generated in the chamber and the pressure of the He gas, the temperature of the wafer is directly adjusted.

The high-density plasma CVD apparatus is supplied with silane ($SiH_4$), oxygen ($O_2$), and argon (Ar). Oxygen ($O_2$), and argon (Ar) of these gases are previously mixed in order to provide a uniform mixed gas. The silane ($SiH_4$) gas and mixed gas are introduced from an injection opening 48 into the chamber.

The oxide film (USG layer 30) deposited on the wafer W is formed through reaction of silane with oxygen. The main cause influencing the deposition rate of the oxide film is the flow rate of silane and the above low frequency power. The deposition rate of the oxide film increases linearly with an increase in the flow rate of silane and also in the low frequency power.

On the other hand, under the above condition, the pressure in the chamber, temperature and flow rate of argon have little effect on the deposition rate of the oxide film. The flow rate of oxygen, which has only to be supplied to oxidize silane, has also little effect on the deposition rate of the oxide film.

As shown in FIG. 8, a wafer W is placed on the electrostatic chuck 46 and is biased at a high frequency of 13.56 MHz by capacitive coupling through the electrostatic chuck 46. Thus, a DC self-biasing voltage occurs between the above plasma and the wafer W. The DC self-biasing voltage accelerates argon ions in the plasma. The accelerated argon ions sputter-etches the oxide film (USG layer 30) once deposited on the wafer W. Thus, the upper surface of the oxide film is flattened.

In the sputter etching process, the flow rate of oxygen and rate of argon as well as the bias voltage of 13.56 MHz are significant. The sputter etching rate increases with an increase in the biasing power at 13.56 MHz. Its gradient was 0.05–0.1 nm/min per 1 W of the biasing power at 13.56 MHz.

It should be noted that a minimum biasing power (high frequency electric power), i.e. threshold value, depending on the plasma power (low frequency power) is required to enable the sputter etching. In this embodiment, the threshold value was a bias power lever to provide the DC self-biasing voltage of −30 V. Incidentally, the electric power of about 1–3 kW at a low frequency of 2 MHz was applied to the coil 44. On the other hand, the electric power of about 3–4 kW at a high frequency of 13.56 MHz was applied to the electrostatic chuck 46.

In order to realize the uniform ion distribution on the wafer W and reduce the re-deposition of the oxide film sputter-etched, the pressure within the chamber is held at 10 m Torr or less. Further, in order to adjust the pressure within the chamber, a turbo pump 50 is provided.

Figure 6:
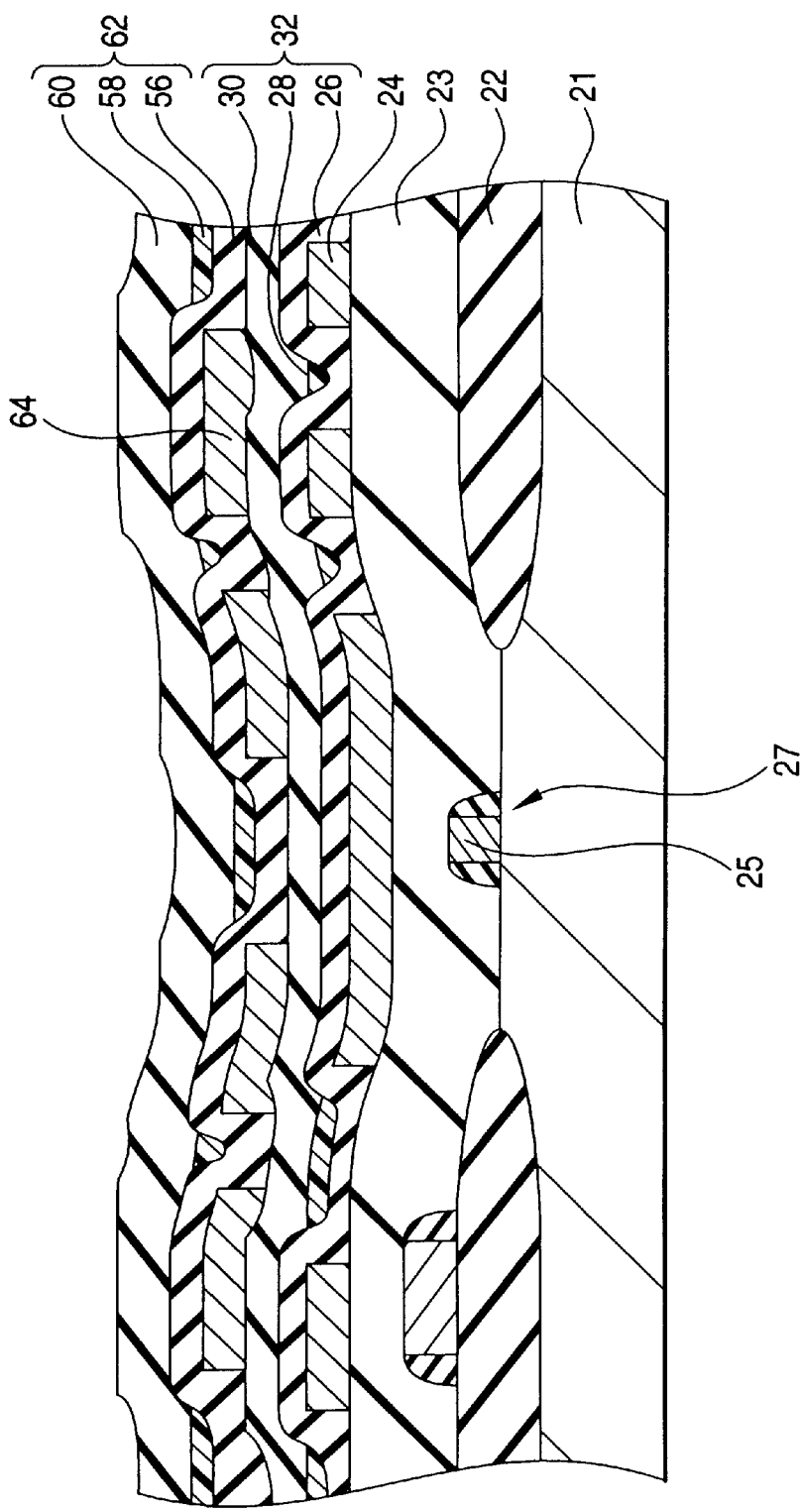

In this way, by adjusting several setting conditions of the high density plasma CVD apparatus 40, the film deposition by CVD and the etching by sputtering can be carried out at a desired rate. Thus, by adjusting the setting conditions in accordance with the depth or shape of the groove 29 shown in FIG. 5, the groove 29 can be embedded with USG and the USG layer 30 having a flat upper surface 30a can be also formed. On the upper flat surface of the inter-metal dielectric film 32, as shown in FIG. 6, a second aluminum wiring 54 and a second inter-metal dielectric film 62 can be formed. The inter-metal dielectric film 62 can be formed by the same procedure as forming the inter-metal dielectric film 32 in such a manner that a USG layer 56, organic SOG layer 58 and USG layer 60 are successively formed. Further, a third et seq. aluminum wiring and inter-metal dielectric film (not shown) can be formed.

In this way, in this embodiment, the inter-metal dielectric film 32 including the USG layer 26 and USG layer 30 can be formed by the process comprising the steps of depositing USG so as to cover the field oxide film 22 and aluminum wiring 24 formed thereon, thereby forming the USG layer 26, applying organic SOG on the USG layer 26 thus formed, thereby forming the organic SOG layer 28, etching back the organic SOG layer 28 so that a part of the organic SOG layer 28 is caused to remain on the groove on the surface of the USG layer 26, and depositing USG on the USG layer 26 inclusive of the remaining SOG layer 28 through the vapor phase technique using high density plasma, thereby forming the USG layer 30.

Thus, the organic SOG layer 28 whose thick layer can be easily formed is left so that the unevenness of the surface of the USG layer 26 is relaxed in a degree. In addition, the USG layer 30 is formed through the vapor phase growth technique using the high density plasma which can realize excellent embedding. Accordingly, the inter-metal dielectric film 32 having a flat upper surface can be formed.

The SOG step accompanied by high cost is carried only once in the step of forming the organic SOG layer 28. The step of forming the inorganic SOG layer is not required so that the production cost can be reduced correspondingly. The lead time required for production can be also shortened. As a result, the cost required for forming the inter-metal dielectric film 32 can be reduced and the lead time for production can be shortened.

Further, since the organic SOG layer 28 left in the groove on the surface of the USG layer 26 can be encircled by the USG layers 26 and 39 having good film quality, even if the material of the organic SOG layer 28 is not so good, the inter-metal dielectric film 32 with excellent dielectric property can be formed.

In summary, the inter-metal dielectric film 32 having a flat upper flat surface with an excellent dielectric property can be formed at low cost and in a short lead time.

In the embodiment, the groove on the surface of the first dielectric film was filled with a dielectric material in such a manner that organic SOG is applied on the first dielectric film and the organic SOG thus applied is etched back so that the organic SOG is left in the groove on the first dielectric film. The present invention should not be limited to such a manner, but can adopt any method having a step in which the groove on the surface of the first dielectric film can be filled with the dielectric material.

In the case of forming the second dielectric film on an underlying layer through the vapor phase growth technique using the high density plasma, the second dielectric film can be embedded excellently on the underlying layer having a groove whose opening diameter is more than 0.1 .m.

The dielectric material which is filled in the groove on the surface of the first dielectric film may be an applied film of a material having low permittivity of $.\leq 3$ such as HSQ (SOG using Hydrogen Silses Quioxane) which is an inorganic silicon film and HSG (tetra-alkoxy sylane+alkyl alkoxy silane).

In the embodiment, although the first dielectric film and the second dielectric film was made of the USG (undoped silicate glass), they should not be limited to this material. For example, both or one of the first and the second dielectric film may be made of FSG (fluorine-doped $SiO_2$). Further, both of one of the first and the second dielectric film may be made of a dielectric material other than the silicon oxide. According to using FSG, parasitic capacitance can be reduced.

In the embodiment described above, although the underlying layer was composed of the field oxide film 22 and aluminum wiring 24 formed thereon, it should not be limited to such a layer. In the present invention, the underlying layer may be generally a layer having an uneven surface.

What is claimed is:

1. A method of manufacturing a semiconductor device having an inter-metal dielectric film constituted by a first dielectric film and a second dielectric film, comprising the steps:

depositing first dielectric film on an underlying wiring layer having an uneven surface;

applying organic SOG on the first dielectric film thus formed, and etching back the organic SOG thus applied so that the organic SOG remains in a groove in a surface of the first dielectric film; and depositing the second dielectric film on said first dielectric film inclusive of the remaining organic SOG through a vapor phase growth method using high density plasma.

2. A method of manufacturing a semiconductor device as set forth in claim 1, wherein the step of forming the first dielectric film comprises a step of forming a silicon oxide film through CVD.

3. A method of manufacturing a semiconductor device as set forth in claim 1, wherein the step of forming the second dielectric film comprises a step of forming a silicon oxide film through a vapor phase growth technique using the high density plasma.

4. A method of manufacturing a semiconductor device as set forth in claim 1, wherein the step of applying organic SOG comprises the step of etching back the organic SOG thus applied so that the organic SOG remains in a groove whose opening diameter is more than 0.1 $\mu$m; and the step of forming the second dielectric film comprises a step of forming a silicon oxide film through a vapor phase growth technique using the high density plasma so that the groove is embedded.

5. A method of manufacturing a semiconductor device having a dielectric film constituted by a first dielectric film and a second dielectric film formed by a process comprising the steps:

depositing the first dielectric film on an underlying wiring layer having an uneven surface;

filling a groove of the first dielectric film thus formed with a dielectric material; and forming the second dielectric film on the first dielectric film inclusive of the filled dielectric material through a vapor phase growth method using high density plasma.

6. A method of manufacturing a semiconductor device as set forth in claim 5, wherein the dielectric material is made of HSQ.

7. A method of manufacturing a semiconductor device as set forth in claim 5, wherein the dielectric material is made of HSG.

8. A method of manufacturing a semiconductor device as set forth in claim 5, wherein at least one of the first and second dielectric material is made of FSG.

* * * * *